(12) United States Patent
Yoo

(10) Patent No.: US 10,341,783 B2
(45) Date of Patent: Jul. 2, 2019

(54) MICROPHONE AND METHOD OF MANUFACTURING THE SAME

(71) Applicant: HYUNDAI MOTOR COMPANY, Seoul (KR)

(72) Inventor: Ilseon Yoo, Suwon-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 147 days.

(21) Appl. No.: 15/376,012

(22) Filed: Dec. 12, 2016

(65) Prior Publication Data

US 2018/0115834 A1 Apr. 26, 2018

(30) Foreign Application Priority Data

Oct. 21, 2016 (KR) .................... 10-2016-0137786

(51) Int. Cl.
| | |
|---|---|
| *H04R 19/00* | (2006.01) |
| *B81B 7/00* | (2006.01) |
| *B81C 1/00* | (2006.01) |
| *H04R 31/00* | (2006.01) |
| *H04R 19/04* | (2006.01) |
| *B81B 3/00* | (2006.01) |

(52) U.S. Cl.
CPC ......... *H04R 19/005* (2013.01); *B81B 3/0094* (2013.01); *B81B 7/0061* (2013.01); *B81C 1/00166* (2013.01); *H04R 19/04* (2013.01); *H04R 31/006* (2013.01); *B81B 2201/0257* (2013.01); *B81B 2203/04* (2013.01); *B81B 2207/07* (2013.01); *H04R 31/003* (2013.01)

(58) Field of Classification Search
CPC .. H04R 19/005; H04R 31/006; H04R 31/003; B81B 7/0061; B81B 2201/0257; B81B 2203/04; B81C 1/00166
USPC ........................................................ 381/174
See application file for complete search history.

(56) References Cited

U.S. PATENT DOCUMENTS

| | | | | |
|---|---|---|---|---|
| 5,490,220 A | * | 2/1996 | Loeppert ............... | B81B 3/0072 381/113 |
| 2003/0016839 A1 | * | 1/2003 | Loeppert ............... | B81B 3/0072 381/174 |
| 2007/0201709 A1 | * | 8/2007 | Suzuki .................. | B81B 3/0072 381/174 |

(Continued)

FOREIGN PATENT DOCUMENTS

| | | |
|---|---|---|
| KR | 10-0571967 B1 | 4/2006 |
| KR | 10-2008-0087172 A | 9/2008 |

*Primary Examiner* — Sean H Nguyen
(74) *Attorney, Agent, or Firm* — Knobbe Martens Olson & Bear LLP

(57) ABSTRACT

A Micro Electro Mechanical System (MEMS) microphone is provided. The MEMS microphone includes: a substrate including an audio hole and having an oxide layer at a predetermined segment along an upper surface edge; a vibration electrode that is supported by a support layer that is formed along an upper surface edge in a state that is separated to the inside of the center from the oxide layer at an upper portion corresponding to the audio hole; a fixed electrode that is formed at an upper portion of the oxide layer and in which one side of the support layer is bonded to one side of a low surface; and a back plate that is formed at an upper portion of the fixed electrode and in which the other side of the support layer is bonded to one side of a low surface.

7 Claims, 10 Drawing Sheets

(56) References Cited

U.S. PATENT DOCUMENTS

2010/0158279 A1* 6/2010 Conti .................. H04R 7/24
                                           381/174
2012/0082325 A1* 4/2012 Sakurauchi ......... B81C 1/00666
                                           381/174
2015/0264464 A1* 9/2015 Okugawa ............ H04R 19/005
                                           381/174
2015/0264476 A1* 9/2015 Uchida ................ H04R 31/00
                                           381/174

* cited by examiner

MICROPHONE AND METHOD OF MANUFACTURING THE SAME

CROSS-REFERENCE TO RELATED APPLICATION

This application claims priority to and the benefit of Korean Patent Application No. 10-2016-0137786 filed in the Korean Intellectual Property Office on Oct. 21, 2016, the entire contents of which are incorporated herein by reference.

BACKGROUND

(a) Field

The present disclosure relates to a microphone and a method of manufacturing the same.

(b) Description of the Related Art

In general, a microphone is a device that converts a voice to an electrical signal and is recently gradually formed in a small size and therefore a microphone using Micro Electro Mechanical System (MEMS) technology has been developed.

Such an MEMS microphone has strong tolerance to moisture and heat, compared with a conventional Electret Condenser Microphone (ECM), may be formed in a downsize, and may be integrated with a signal processing circuit.

In a communication environment of the MEMS microphone, surrounding noise is a large restriction element, and technology for removing noise of such a surrounding environment is required.

Recently, as a general method of removing surrounding noise, a method of analyzing a noise spectrum at a non-voice segment using an audio element and estimating a noise spectrum at a voice segment using the noise spectrum to subtract noise from a signal in which a voice and noise are mixed, thereby removing noise is mainly used.

Further, an MEMS microphone requires a robust structure for noise of a vibration as well as noise of the voice, i.e., a sound.

Particularly, in an MEMS microphone that is applied to a vehicle, a distance of a sound source is far, and the MEMS microphone requires a more robust structure than an element that is applied to a mobile device because of a vehicle environment in which noise by a vibration variably occurs.

That is, in an MEMS microphone that is applied to a vehicle, a research and development of a structure that can improve sensitivity to even noise by a cyclically occurring vibration is required.

The disclosure of this section is to provide background of the invention. Applicant notes that this section may contain information available before this application. However, by providing this section, Applicant does not admit that any information contained in this section constitutes prior art.

SUMMARY

An embodiment of the present invention provides a microphone including: a substrate including an audio hole and having an oxide layer at a predetermined segment along an upper surface edge; a vibration electrode that is supported by a support layer that is formed along an upper surface edge in a state that is separated to the inside of the center from the oxide layer at an upper portion corresponding to the audio hole; a fixed electrode that is formed at an upper portion of the oxide layer and in which one side of the support layer is bonded to one side of a low surface; and a back plate that is formed at an upper portion of the fixed electrode and in which the other side of the support layer is bonded to one side of a low surface.

The support layer may include a connection electrode at the other side that is connected with the back plate.

At the fixed electrode, a plurality of air passages may be penetrated.

At the back plate, a plurality of penetration holes may be formed to correspond to the air passage.

At the back plate, an electrode passage may be formed at the outside of the plurality of penetration holes, and an electrode pad may be formed at the electrode passage to be electrically connected with the vibration electrode and the fixed electrode.

According to an embodiment of the present invention, in a structure that maintains a state that is separated from a substrate while connecting a vibration electrode to a low surface of a fixed electrode and a back plate, when a vibration is injected from the outside, a vibration electrode is suppressed from vibrating by the substrate, and by corresponding vibration displacements of the vibration electrode and the fixed electrode, vibration noise can be minimized.

In addition, an effect that may be obtained or estimated due to an embodiment of the present invention is directly or implicitly described in a detailed description of an embodiment of the present invention. That is, various effects that are estimated according to an embodiment of the present invention will be described within a detailed description to be described later.

DETAILED DESCRIPTION OF THE EMBODIMENTS

Hereinafter, an embodiment of the present invention will be described in detail with reference to the accompanying drawings. However, drawings shown hereinafter and a detailed description to be described later relate to an embodiment among several embodiments for effectively describing a characteristic of the present invention. Therefore, the present invention is not limited only to the following drawing and description.

Figure 1:
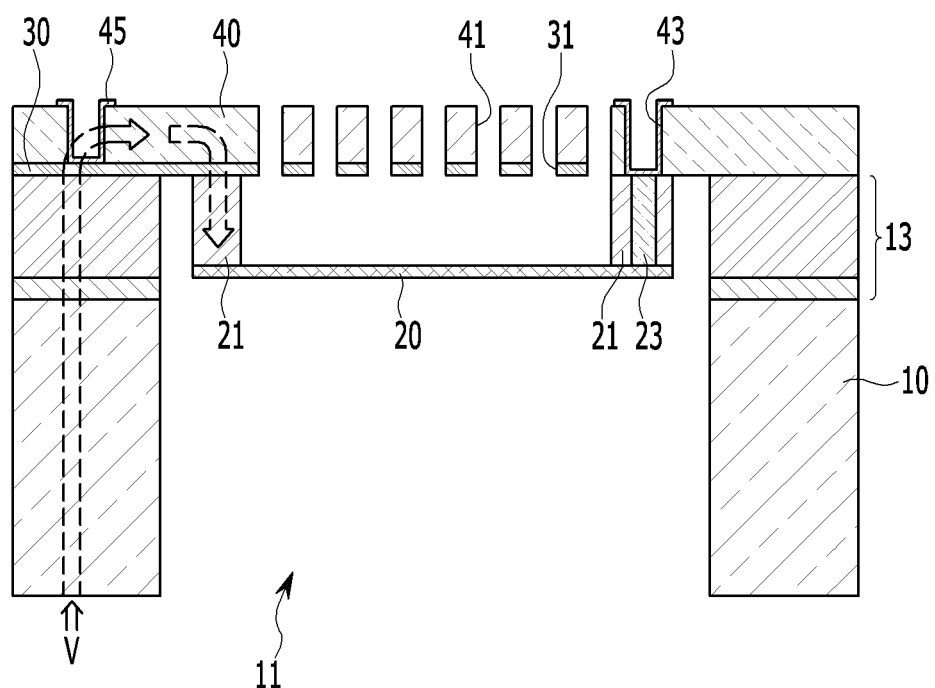
FIG. 1 is a schematic cross-sectional view of a microphone according to an embodiment of the present invention.

FIG. 1 is a schematic cross-sectional view of a microphone according to an embodiment of the present invention.

In the MEMS microphone of the illustrated embodiment of FIG. 1, a sound receiving hole (through portion) 11 is formed through the base (substrate) 10. In embodiments, when viewed from over the microphone in a first direction, the base 10 forms a closed loop surrounding the sound receiving hole 11. An oxide layer 13, 13b is formed over the base 10 and a back plate 40 is formed over the oxide layer 13. In embodiments, the base plate 40 includes a first portion that covers the sound receiving hole 11 (or overlaps the sound receiving hole 11 when viewed in the first direction from the top).

Under the first portion of the back plate 40 that overlaps the sound receiving hole 11 when viewed in the first direction (and on a surface of the back plate 40 facing the sound receiving hole 11), the fixed electrode 30 is formed. The vibration electrode (membrane) 20 is formed under the fixed electrode 30, covering at least part of the sound receiving hole.

In embodiments, the vibration electrode 20 does not cover entire the sound receiving hole 11 and, when viewed from the top (in the first direction), the vibration electrode 20 is enclosed within an opening of the base 10 defining the sound receiving hole 11 but separated from the base 10 such that undesirable vibration of the base 10 is not directly transferred the vibration electrode 20 and that noise from the undesirable vibration is minimized in the microphone output signals.

In embodiments, the vibration electrode 20 is hung by a structure (stretch, drop) of the oxide layer 13b (the structure of support layer 21 in FIG. 1) extending from a bottom surface of the first base plate 40 toward the sound receiving hole 11. In embodiments, the structure holding the vibration electrode 20 (connecting the back plate 40 and the vibration electrode 20) is separated or isolated from a portion of the oxide layer 13 formed over the base 10 (overlapping the base 10 when viewed in the first direction) and overlaps the sound receiving hole 11 when viewed in the first direction for isolating the vibration electrode 20 from undesirable vibration of the base 10.

In embodiments, when viewed in the first direction from over the microphone, the structure holding the vibration electrode 20 forms a closed loop structure in the opening of the base 10 defining or corresponding to the sound receiving hole 11, and the closed loop structure does not overlap the base 10.

In embodiments, the structure (support 21 of oxide layer 13b) holding the vibration electrode 20 includes a through hole in which a conductive member (line) 23 electronically connecting the vibration electrode 20 and an electrode terminal 43 formed in the back plate.

Referring to FIG. 1, a microphone 1 according to an embodiment of the present invention includes a substrate 10, a vibration electrode 20, a fixed electrode 30, and a back plate 40 and is formed using Micro Electro Mechanical System (MEMS) technology.

At the substrate 10, an audio hole 11 that penetrates the center is formed.

Further, the substrate 10 may be made of a silicon material.

At an upper surface of such a substrate 10, an oxide layer 13 is formed at a predetermined segment in a vertical direction along an edge.

The vibration electrode 20 is located at an upper portion corresponding to the audio hole 11 of the substrate 10.

The vibration electrode 20 maintains a state that is separated to the inside by a predetermined gap from the oxide layer 13.

Such a vibration electrode 20 is fixed by a support layer 21 that is formed along an upper surface edge.

In this case, the support layer 21 includes a connection electrode 23 at the other side that is connected with the back plate 40 to be described hereinafter.

The fixed electrode 30 is formed at an upper portion of the oxide layer 13.

Further, the fixed electrode 30 penetrates a plurality of air passages 31.

One side of the support layer 21 is bonded to one side of a low surface of such a fixed electrode 30.

The back plate 40 is formed at an upper portion of the fixed electrode 30.

Further, at a location corresponding to the plurality of air passages 31 of the back plate 40, a plurality of penetration holes 41 are penetrated.

Further, in the back plate 40, at the outside of a plurality of penetration holes 41, an electrode passage 43 is formed.

In this case, an electrode pad 45 is formed in the electrode passage 43, and the vibration electrode 20 and the fixed electrode 30 are electrically connected with an external signal processing circuit using the electrode pad 45.

The other side of the support layer 21 is bonded to one side of a low surface of such a back plate 40.

Hereinafter, a method of manufacturing the microphone 1 having such a structure will be described.

FIGS. 2 to 10 are diagrams illustrating a sequential process of a microphone according to an embodiment of the present invention.

Figure 2:
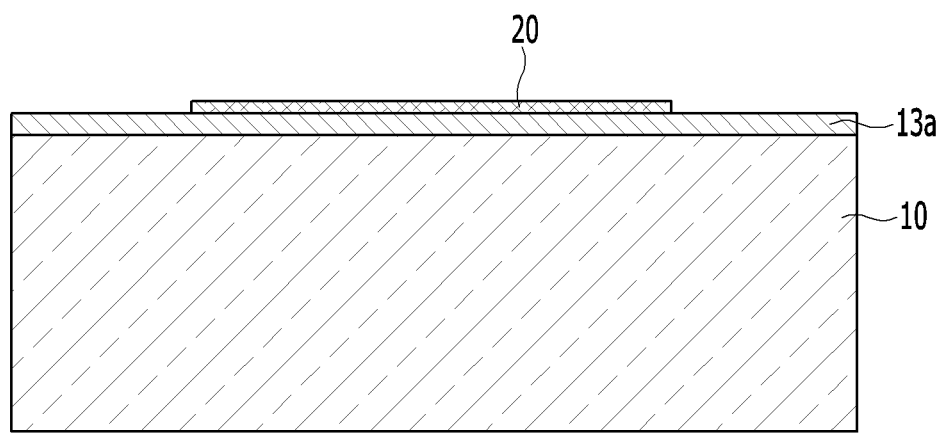
FIGS. 2 to 10 are diagrams illustrating a sequential process of a microphone according to an embodiment of the present invention.

Referring to FIG. 2, in a method of manufacturing the microphone 1 according to an embodiment of the present invention, a substrate 10 is first prepared.

Thereafter, at one surface of the substrate 10, a first oxide film 13a is formed, and at an upper surface of the first oxide film 13a, a vibration electrode 20 is formed.

In this case, the vibration electrode 20 may be formed through patterning after coating a vibration film at an entire upper surface of the first oxide film 13a.

Figure 3:
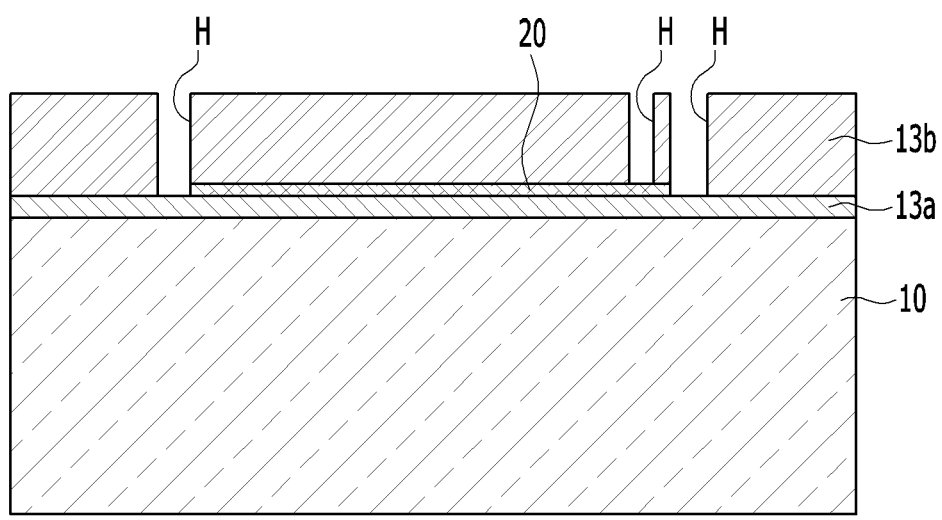

Referring to FIG. 3, at an upper surface of the vibration electrode 20 and the first oxide film 13a, a second oxide film 13b is formed.

Thereafter, a plurality of via holes H are penetrated at the second oxide film 13b.

In this case, the plurality of via holes H are formed at a location that is connected with the vibration electrode 20.

Figure 4:
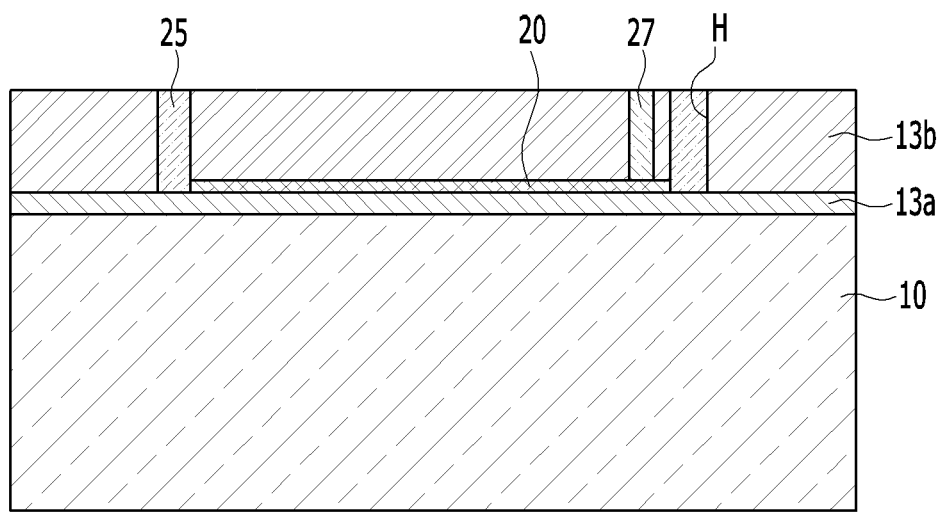

Referring to FIG. 4, at each of the plurality of via holes H, a connection electrode and a sacrifice electrode 25 are formed.

In this case, the connection electrode 23 contacts one side of an upper surface of the vibration electrode 20.

Such a connection electrode 23 performs a function as a medium that connects and electrifies the vibration electrode 20 and the external signal processing circuit.

Further, the sacrifice electrode 25 penetrates the second oxide film 13b at a location corresponding to both end portions of the vibration electrode 20.

Figure 5:
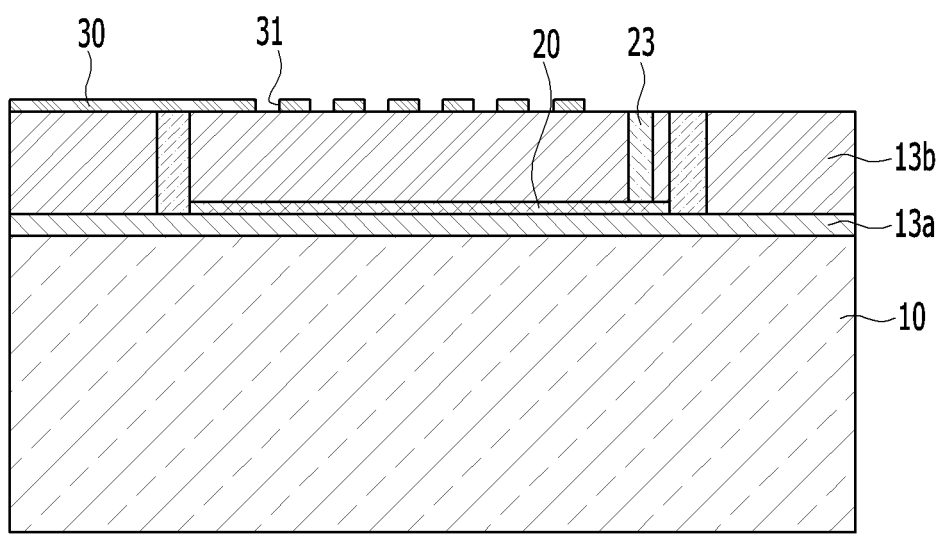

Referring to FIG. 5, at an upper portion of the second oxide film 13b, a fixed electrode 30 is formed.

The fixed electrode 30 has a plurality of air passages 31, and the air passage 31 is formed at a location corresponding to an upper portion of the vibration electrode 20.

Figure 6:
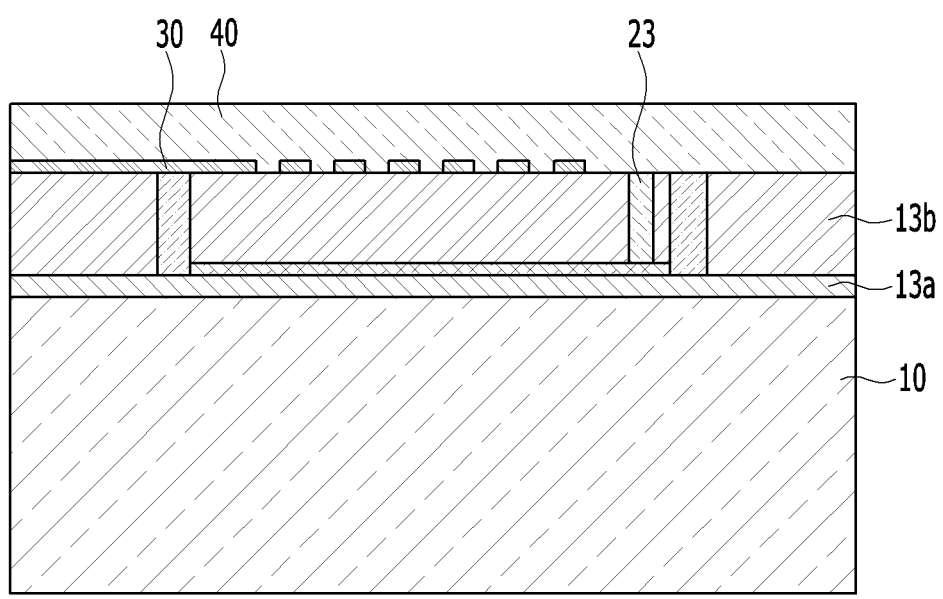

Referring to FIG. 6, at an upper portion of the second oxide film 13b and the fixed electrode 30, a back plate 40 is formed.

The back plate 40 may be made of a silicon nitride (Si—N) material.

Figure 7:
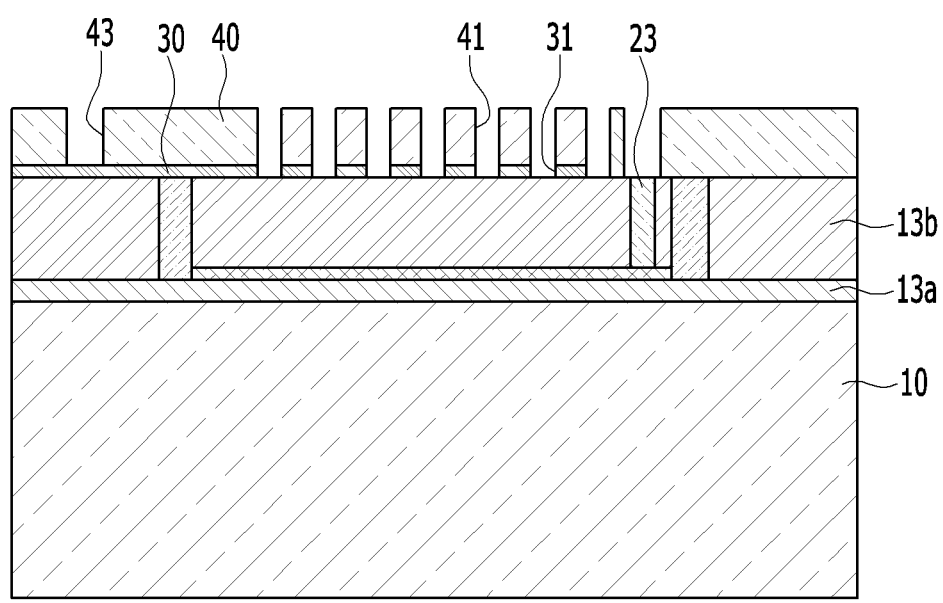

Referring to FIG. 7, at the back plate 40, a plurality of penetration holes 41 are formed.

In this case, the plurality of penetration holes 41 are formed at a location corresponding to the air passage 31 of the fixed electrode 30.

Thereafter, at the back plate 40, an electrode passage 43 is formed.

The electrode passage 43 is formed at the outside of the plurality of penetration holes 41 and is formed at a location corresponding to the connection electrode 23 and an upper surface of the fixed electrode 30.

Figure 8:
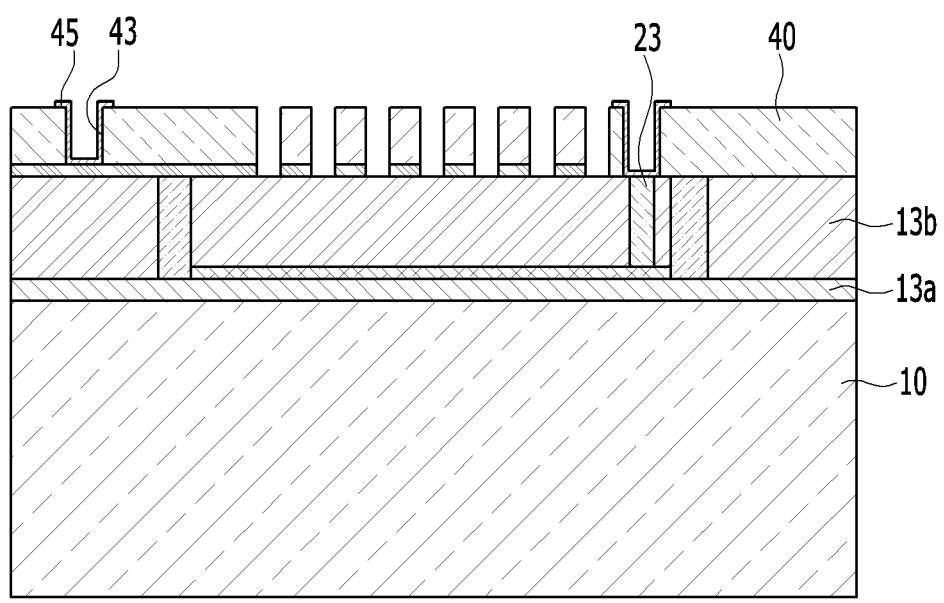

Referring to FIG. 8, at the electrode passage 43, an electrode pad 45 that contacts the fixed electrode 30 and the connection electrode 23 is formed.

The electrode pad 45 is connected with the external signal processing circuit.

Figure 9:
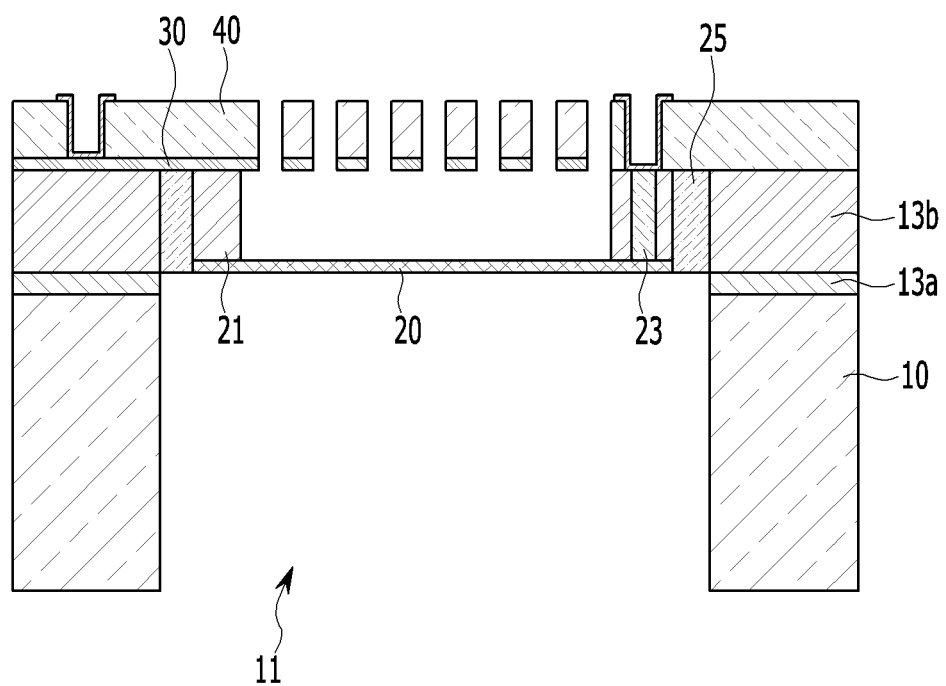
Figure 10:
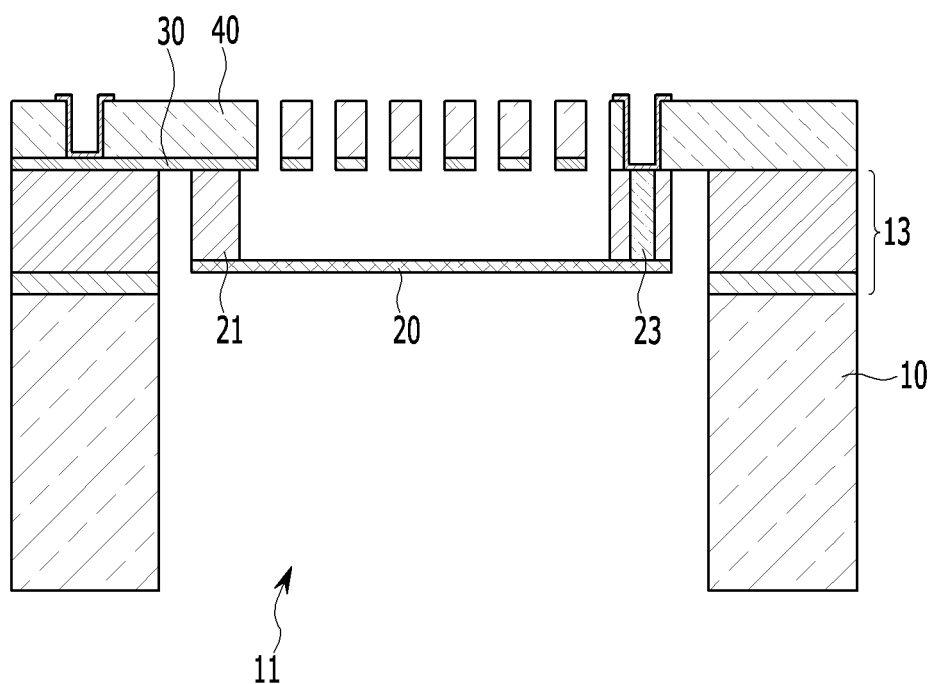

Referring to FIGS. 9 and 10, an audio hole 11 that penetrates the substrate 10 is formed.

The audio hole 11 may be formed at a central portion of the substrate 10.

Thereafter, by removing a portion of the first oxide film 13a and the second oxide film 13b, an oxide layer 13 and a support layer 21 are each formed.

In this case, a central portion of the first oxide film 13a is removed to have the same diameter to correspond to an outer side surface of the connection electrode 23.

Further, the second oxide film 13b removes a central portion, except for a predetermined segment along an upper surface edge of the vibration electrode 20 among the second oxide film 13b corresponding to an upper portion of the vibration electrode 20.

Thereafter, a sacrifice electrode 25 that is formed at both end portions of the vibration electrode 20 is removed.

Accordingly, the vibration electrode 20 is chemically bonded by the support layer 21 that is formed along an upper surface edge circumference.

Therefore, in the microphone 1 according to an embodiment of the present invention, when a vibration signal V is injected from the outside, the vibration signal V is transferred to the vibration electrode 20 via the fixed electrode 30 along the substrate 10.

That is, because the vibration electrode 20 is connected with the fixed electrode 30 while maintaining a state that is separated from the substrate 10, a vibration by the substrate is suppressed, and by corresponding vibration displacements of the vibration electrode 20 and the fixed electrode 30 by the vibration signal V, a noise signal can be minimized.

While this invention has been described in connection with what is presently considered to be embodiments, it is to be understood that the invention is not limited to the disclosed embodiments, but, on the contrary, is intended to cover various modifications and equivalent arrangements.

<Description of symbols>

| | |
|---|---|
| 1: microphone | 10: substrate |
| 11: audio hole | 13: oxide layer |
| 13a: first oxide film | 13b: second oxide film |
| 20: vibration electrode | 21: support layer |
| 23: connection electrode | 25: sacrifice electrode |
| 30: fixed electrode | 31: air passage |
| 40: back plate | 41: penetration hole |
| 43: electrode passage | 45: electrode pad |
| V: vibration signal | |

What is claimed is:

1. A method of manufacturing a microphone, the method comprising:

forming an oxide layer, a support layer and a vibration electrode, wherein the oxide layer is formed over a substrate, wherein the vibration electrode is separated from the oxide layer with a gap therebetween, wherein the support layer is formed over the vibration electrode, wherein the vibration electrode is connected to the support layer;

forming a fixed electrode over the oxide layer that is formed over the substrate; and forming a back plate over the fixed electrode and the oxide layer, wherein a first portion of the support layer is bonded to and contacts a bottom surface of the fixed electrode, wherein a second portion of the support layer is bonded to and contacts a bottom surface of the back plate, wherein the forming of the oxide layer, the support layer and the vibration electrode comprises:

forming a first oxide film over the substrate;

forming the vibration electrode over the first oxide film;

forming a second oxide film over the vibration electrode;

forming a plurality of via holes that penetrate the second oxide film in order to connect with the vibration electrode; and forming a sacrifice electrode and a connection electrode in the plurality of via holes, wherein the fixed electrode having a plurality of air passages is formed over the second oxide film.

2. The method of claim 1, wherein the sacrifice electrode contacts an end portion of the vibration electrode, wherein the connection electrode contacts an upper surface of the vibration electrode.

3. The method of claim 1, further comprising:

forming a plurality of penetration holes in the back plate;

forming electrode passages over the fixed electrode and the connection electrode at the outside of the plurality of penetration holes; and forming electrode pads in the electrode passages, wherein the electrode pads contact the fixed electrode and the connection electrode, respectively.

4. The method of claim 3, wherein each of the plurality of penetration holes is formed at a location corresponding to one of the air passages of the fixed electrode.

5. The method of claim 1, further comprising: after the forming of the back plate, forming an audio hole that penetrates the substrate;

removing portions of the first oxide film and the second oxide film; and removing the sacrifice electrode.

6. The method of claim 5, wherein the removing of the portions of the first oxide film and the second oxide film exposes the sacrifice electrode.

7. The method of claim 5, wherein the removing of the portions of the first oxide film and the second oxide film comprises removing a central portion of the second oxide film except for a predetermined segment along an upper surface edge of the vibration electrode.

* * * * *